United States Patent
Chuang et al.

(10) Patent No.: US 9,484,352 B2
(45) Date of Patent: Nov. 1, 2016

(54) METHOD FOR FORMING A SPLIT-GATE FLASH MEMORY CELL DEVICE WITH A LOW POWER LOGIC DEVICE

(71) Applicant: Taiwan Semiconductor Manufacturing Co., Ltd., Hsin-Chu (TW)

(72) Inventors: Harry-Hak-Lay Chuang, Zhubei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/573,208

(22) Filed: Dec. 17, 2014

(65) Prior Publication Data

US 2016/0181266 A1 Jun. 23, 2016

(51) Int. Cl.
*H01L 29/788* (2006.01)
*H01L 27/115* (2006.01)

(52) U.S. Cl.
CPC ... *H01L 27/11526* (2013.01); *H01L 27/11541* (2013.01); *H01L 29/788* (2013.01)

(58) Field of Classification Search
CPC .......................... H01L 27/115; H01L 27/11521
USPC ................................... 257/315–316; 438/591
See application file for complete search history.

(56) References Cited

U.S. PATENT DOCUMENTS

| 6,228,695 B1 * | 5/2001 | Hsieh | H01L 21/28273 257/E21.209 |
| 2001/0012662 A1 * | 8/2001 | Hsieh | H01L 21/28273 438/257 |
| 2016/0013198 A1 * | 1/2016 | Liu | H01L 27/11524 257/322 |

* cited by examiner

Primary Examiner — Jami M Valentine
(74) Attorney, Agent, or Firm — Eschweiler & Associates, LLC (57) ABSTRACT

An embedded flash memory device is provided. A gate stack includes a control gate arranged over a floating gate. An erase gate is arranged adjacent to a first side of the gate stack. A word line is arranged adjacent to a second side of the gate stack that is opposite the first side. The word line includes a word line ledge exhibiting a reduced height relative to a top surface of the word line and on an opposite side of the word line as the gate stack. A polysilicon logic gate has a top surface approximately even with the word line ledge. An ILD layer is arranged over the gate stack, the erase gate, the polysilicon logic gate, and the word lines. A contact extends through the ILD layer. A method of manufacturing the embedded flash memory device is also provided.

20 Claims, 11 Drawing Sheets

METHOD FOR FORMING A SPLIT-GATE FLASH MEMORY CELL DEVICE WITH A LOW POWER LOGIC DEVICE

BACKGROUND

A trend in the semiconductor manufacturing industry is to integrate different semiconductor components of a composite semiconductor device into a common semiconductor structure. Such integration advantageously allows lower manufacturing costs, simplified manufacturing procedures, and increased operational speed. One type of composite semiconductor device is an embedded flash memory device. An embedded flash memory device includes an array of flash memory cell devices and logic devices supporting operation of the flash memory cell devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

An embedded flash memory device includes an array of flash memory cell devices and logic devices supporting operation of the flash memory cell devices. Common types of flash memory cell devices include stacked-gate flash memory cell devices and split-gate flash memory devices (e.g., third generation SUPERFLASH (ESF3) memory cell devices). Compared to stacked-gate flash memory cell devices, split-gate flash memory cell devices have lower power consumption, higher injection efficiency, less susceptibility to short channel effects, and over erase immunity. As such, split-gate flash memory cell devices are more prevalent. Common types of logic devices include address decoders and read/write circuitry.

According to some methods for manufacturing an embedded flash memory device, high κ metal gate (HKMG) technology is employed. Split-gate flash memory cell devices are formed with a memory region of a semiconductor substrate. Logic devices are then formed with a logic region of the semiconductor substrate and with sacrificial gates insulated from the logic region by a high κ dielectric (i.e., a dielectric with a dielectric constant exceeding 3.9). A first interlayer dielectric (ILD) layer is formed over the memory and logic regions, and a planarization is performed into the first ILD layer to the sacrificial gates. The sacrificial gates of the logic devices are replaced with metal gates, and a second ILD layer is formed over the logic devices with contacts extending therethrough to the logic devices and the memory cell devices.

HKMG technology has become one of the front runners for the logic devices of next generation embedded flash memory devices using 28 nm or smaller feature sizes. Among other things, HKMG technology reduces leakage current, increases maximum drain current, mitigates the effects of fermi-level pinning, and allows reduced threshold voltages. However, even though HKMG technology offers performance improvements, there is room for improvement when it comes to power efficiency. In some applications, such as mobile applications, power efficiency is more important than performance.

In view of the foregoing, the present application is directed to a method for manufacturing an embedded flash memory device with low power logic devices. A pair of gate stacks is formed over a memory region of a semiconductor substrate. A polysilicon layer is formed over the gate stacks, and subsequently etched back to form an erase gate between the gate stacks. A hard mask layer is formed over gate stacks and the polysilicon layer, and subsequently etched back over the memory region. The polysilicon layer and the hard mask layers are etched to form word lines adjacent to the gate stacks opposite the erase gate, and logic devices over a logic region of the semiconductor substrate. An ILD layer is formed over the memory and logic regions, and contacts are formed therethrough. Advantageously, the method is compatible with next generation manufacturing processes using 28 nm or smaller feature sizes and self-aligns the word lines. Further, the method advantageously reduces costs compared to other methods using HKMG technology due to the use of a shared polysilicon layer and a shared hard mask layer for the word lines, the erase gates, and the logic devices.

The present application is also directed an embedded flash memory device with low power logic devices. A pair of split-gate flash memory cell devices includes a memory region of a semiconductor device. Arranged over the memory region, the pair includes gate stacks arranged on opposing sides of an erase gate, and word lines adjacent to the gate stacks opposite the erase gate. The word lines include word line ledges exhibiting reduced heights relative to top surfaces of the word lines and opposite the erase gate. Logic devices include a logic region of the semiconductor substrate. Arranged over the logic region, the logic devices include logic gates insulated from the logic region by a dielectric and having top surfaces about even with the word line ledges. The word lines, the erase gate, and the logic gates are formed from polysilicon. An ILD layer is arranged over the pair and the logic devices with contacts extending therethrough. Advantageously, the embedded flash memory device has a high power efficiency compared to HKMG embedded flash memory devices.

Figure 1:
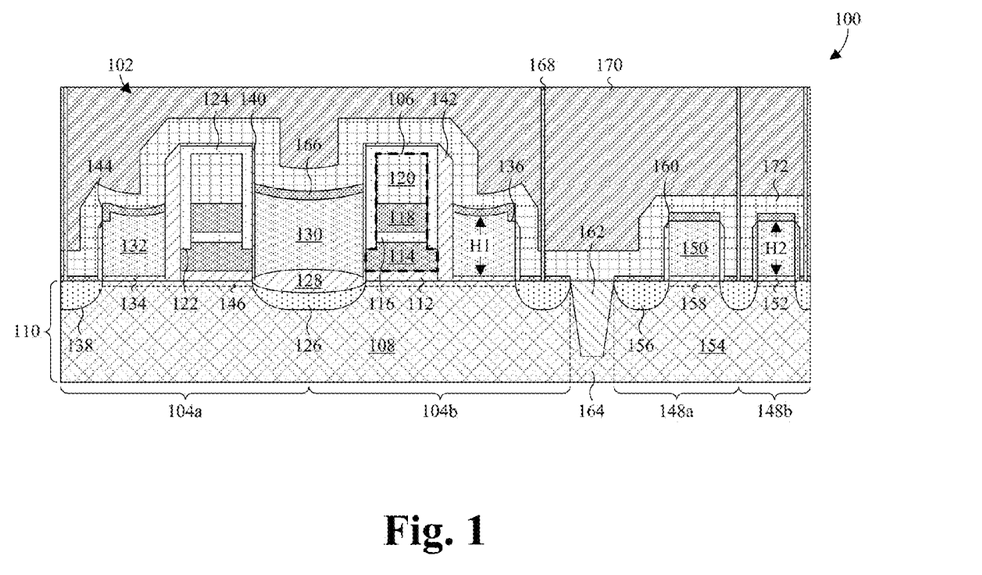
FIG. 1 illustrates a cross-sectional view of some embodiments of an embedded flash memory device with a split-gate flash memory cell device and a low power logic device.

With reference to FIG. 1, a cross-sectional view 100 of some embodiments of an embedded flash memory device is provided. The embedded flash memory device includes one or more pairs 102 of split-gate flash memory cell devices 104a, 104b. For example, as illustrated, the embedded flash memory device includes a pair 102 having a first split-gate flash memory cell device 104a and a second split-gate flash memory cell device 104b. The memory cell devices 104a, 104b of the pairs 102 store data in a nonvolatile manner and are, for example, third generation SUPERFLASH (ESF3) memory cell devices.

Gate stacks 106 corresponding to the memory cell devices 104a, 104b are spaced over a memory region 108 of a semiconductor substrate 110. The semiconductor substrate 110 is, for example, a bulk semiconductor substrate or a silicon-on-insulator (SOI) substrate. A gate stack 106 of a memory cell device 104a, 104b, typically of each memory cell device 104a, 104b, includes a floating gate dielectric region 112, a floating gate 114, a control gate dielectric region 116, a control gate 118, and a hard mask 120. The floating gate 114 is arranged over the memory region 108 with the floating gate dielectric region 112 interposed between the memory region 108 and the floating gate 114. Further, the floating gate 114 includes a floating gate ledge 122 exhibiting a reduced height relative to a top surface of the floating gate 114 and surrounding a core region of the floating gate 114. The floating gate 114 is, for example, doped polysilicon, and the floating gate dielectric region 112 is, for example, an oxide, such as silicon dioxide. The control gate 118 is arranged over the core region with the control gate dielectric region 116 interposed between the core region and the control gate 118. The control gate 118 is, for example, doped polysilicon, and the control gate dielectric region 116 is, for example, an oxide-nitride-oxide (ONO) film. The hard mask 120 is arranged over the control gate 118, and is, for example, silicon nitride.

Dielectric liners 124 corresponding to the gate stacks 106 extend from the floating gate ledges 122 of the corresponding gate stacks 106 to line the control gate dielectric regions 116, the control gates 118, and the hard masks 120. For example, the dielectric liners 124 line sidewalls of the control gate dielectric regions 116 and the control gates 118, and line top surfaces and sidewalls of the hard masks 120. Typically, there is a one-to-one correspondence between the gate stacks 106 and the dielectric liners 124. The dielectric liners 124 are, for example, ONO films.

First memory source/drain regions 126, erase gate dielectric regions 128, and erase gates 130, corresponding to the memory cell pairs 102 are arranged between the memory cell devices 104a, 104b of the corresponding memory cell pairs 102. Typically, each memory cell pair 102 includes a first memory source/drain region 126, an erase gate dielectric region 128, and an erase gate 130. The erase gates 130 are arranged over the first memory source/drain regions 126 with the erase gate dielectric regions 128 interposed between the erase gates 130 and the first memory source/drain regions 126. The erase gates 130 are, for example, doped polysilicon, the first memory source/drain regions 126 are, for example, n- or p-type doped regions of the semiconductor substrate 110, and the erase gate dielectric regions 128 are, for example, oxide, such as silicon dioxide.

Word lines 132, and word line dielectric regions 134, corresponding to the gate stacks 106 are arranged adjacent to the corresponding gate stacks 106 opposite the erase gates 130. Typically, each gate stack 106 is associated with a word line 132 and a word line dielectric region 134. The word lines 132 are arranged over the memory region 108 with the word line dielectric regions 134 interposed between the word lines 132 and the memory region 108. Further, the word lines 132 include word line ledges 136 exhibiting reduced heights relative to top surfaces of the word lines 132 and extending along edges of the word lines 132 that are on opposite sides of the word lines 132 as the gate stacks 106. In some embodiments, the word lines 132 have a height H1 of about 800 Angstroms, and the word line ledges 136 have a height of about 700 Angstroms. The word lines 132 are, for example, doped polysilicon, and the word line dielectric regions 134 are, for example, oxide, such as silicon dioxide.

Second memory source/drain regions 138 corresponding to the word lines 132 are arranged adjacent to the corresponding word lines 132 opposite the gate stacks 106. Typically, there is a one-to-one correspondence between the second memory source/drain regions 138 and the word lines 132. The second memory source/drain regions 138 are, for example, n- or p-type doped regions of the semiconductor substrate 110. In some embodiments, neighboring memory cell pairs 102 share a second memory source/drain region 138.

Dielectric spacer regions (i.e., dielectric spacers) 140, 142, 144 are arranged along sidewalls of the word lines 132, the erase gates 130, and the gate stacks 106. First dielectric spacer regions 140 are arranged along sidewalls of the gate stacks 106 between the gate stacks 106 and the erase gates 130. Second dielectric spacer regions 142 are arranged along sidewalls of the gate stacks 106 between the gate stacks 106 and the word lines 132. Third dielectric spacer regions 144 are arranged along sidewalls of the word lines 132 on opposite sides of the word lines 132 as the second dielectric spacer regions 142. The first and second dielectric spacer regions 140, 142 are, for example, oxide, such as silicon dioxide, and the third dielectric spacer regions 144 are, for example, silicon nitride.

In operation, a memory cell device 104a, 104b, typically each of the memory cell devices 104a, 104b, store a variable amount of charge, such as electrons, in the floating gate 114. The amount of charge stored in the floating gate 114 represents a binary value and is varied through program, read, and erase operations. These operations are performed through selective biasing of the control gate 118, the word line 132, and the erase gate 130.

During a program operation of a memory cell device 104a, 104b, the word line 132 is biased and the control gate 118 is biased with a high (e.g., at least an order of magnitude higher) voltage relative to voltages surrounding the floating gate 114 (e.g., the voltage on the word line 132). The high bias voltage promotes Fowler-Nordheim tunneling of carriers from an underlying channel region 146 between the first memory source/drain region 126 and the second memory source/drain region 138 towards the control gate 118. As the carriers tunnel towards the control gate 118, the carriers become trapped in the floating gate 114.

During an erase operation of a memory cell device 104a, 104b, the erase gate 130 is biased with a high (e.g., at least an order of magnitude higher) voltage relative to voltages surrounding the floating gate 114 (e.g., the voltage on the control gate 118). The high bias voltage promotes Fowler-Nordheim tunneling of carriers from the floating gate 114 towards the erase gate 130. As the carriers tunnel towards the erase gate 130, the carriers become dislodged or otherwise removed from the floating gate 114.

Charge stored in the floating gate 114 of a memory cell device 104a, 104b screens an electric field formed between the control gate 118 and the channel region 146 when the control gate 118 is biased. This has an effect of increasing the threshold voltage $V_{th}$ of the memory cell device 104a, 104b by an amount $\Delta V_{th}$. Therefore, during a read operation of a memory cell device 104a, 104b, the word line 132 is biased and the control gate 118 is biased with a voltage greater than $V_{th}$, but less than $V_{th}+\Delta V_{th}$. If current flows through the channel region 146, the floating gate 114 is in one state; otherwise it's in another state.

With continued reference to FIG. 1, the embedded flash memory device further includes one or more logic devices 148a, 148b. For example, as illustrated, the embedded flash memory device includes a first logic device 148a and a second logic device 148b. The logic devices 148a, 148b coordinate to implement logic supporting operation of the memory cell pairs 102 and are, for example, transistors. In some embodiments, the logic devices 148a, 148b are arranged around the memory cell pairs 102. Further, in some embodiments, as illustrated, at least some of the logic devices 148a, 148b are connected in series.

Logic gates 150, and logic gate dielectric regions 152, corresponding to the logic devices 148a, 148b are spaced over a logic region 154 of the semiconductor substrate 110. Typically, each logic device 148a, 148b includes a logic gate 150 and a logic gate dielectric region 152. The logic gates 150 are, for example, doped polysilicon, and the logic gate dielectric regions 152 are, for example, an oxide, such as silicon dioxide. In some embodiments, the logic gates 150 have heights less than the heights of word lines 132 (e.g., 700 Angstroms versus 800 Angstroms) and/or less than half the heights of the gate stacks 106. Further, in some embodiments, the logic gates 150 have heights H2 about even with the word line ledges 136. For example, the logic gates 150 have heights H2 of about 700 Angstroms.

Advantageously, by forming the logic gates 150 and the logic gate dielectric regions 152 out of polysilicon and oxide, respectively, the power efficiency of the logic devices 148a, 148b is improved compared to HKMG logic devices. Further, by shrinking the logic gates 150 relative to the size of the memory cell devices 104a, 104b and HKMGs, the power efficiency of the logic devices 148a, 148b is further improved. For example, in some embodiments, the gate stacks 106 have heights H2 at least about two times the heights of the logic devices 148.

Logic source/drain regions 156 corresponding to the logic gates 150 are arranged adjacent to the corresponding logic gates 150. Typically, each logic gate 150 is associated with two logic source/drain regions 156. A logic source/drain region 156 can be individual to the corresponding logic gate 150 or shared by two or more logic gates 150. The logic source/drain regions 156 correspond to n- or p-type doped regions of the logic region 154. In operation, channel regions 158 form between the logic source/drain regions 156 under the logic gates 150.

Fourth dielectric spacer regions 160 corresponding to the logic gates 150 are arranged along sidewalls of the logics gates 150. Typically, each logic gate 150 includes a pair of fourth dielectric spacer regions 160 arranged on opposing sides of the logic gate 150 between the logic source/drain regions 156 corresponding to the logic gate 150. The fourth dielectric spacer regions 160 are, for example, oxide, such as silicon dioxide.

With yet continued reference to FIG. 1, an isolation region 162 is arranged in an intermediate region 164 of the semiconductor substrate 110 between the memory region 108 and the logic region 154 to isolate the memory cell devices 104a, 104b from the logic devices 148a, 148b. In some embodiments, the isolation region 162 and the intermediate region 164 are ring-shaped and surround the memory cell devices 104a, 104b. The isolation region 162 is, for example, a shallow trench isolation (STI) region, a deep trench isolation (DTI) isolation, or an implant isolation region.

Silicide pads 166 are arranged over the second memory source/drain regions 138, the erase gates 130, the word lines 132, the logic gates 150, and the logic source/drain regions 156. Contacts 168 extend through an ILD layer 170, and a contact etch stop layer 172, arranged over the memory cell devices 104a, 104b and the logic devices 148a, 148b to the silicide pads 166. The contact etch stop layer 172 is arranged between the memory cell and logic devices 104a, 104b, 148a, 148b and the ILD layer 170, and is, for example, silicon nitride. The ILD layer 170 is, for example, a low κ dielectric (i.e., a dielectric with a dielectric constant less than 3.9) or silicon dioxide. The contacts 168 are, for example, metal, such as tungsten.

Figure 2:
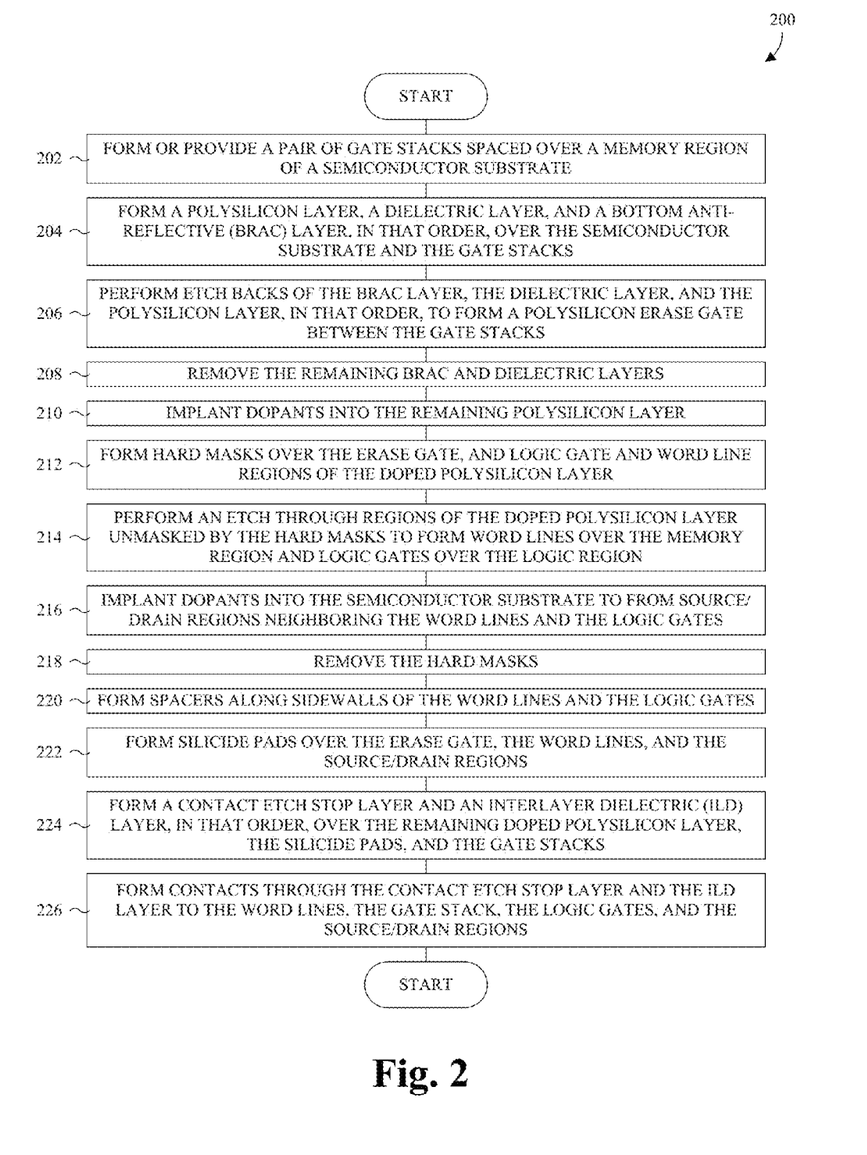
FIG. 2 illustrates a flow chart of some embodiments of a method for manufacturing an embedded flash memory device having a split-gate flash memory cell device and a low power logic device.

With reference to FIG. 2, a flowchart 200 provides some embodiments of a method for manufacturing an embedded flash memory device having a split-gate flash memory cell and a low power logic device.

At 202, a pair of gate stacks are formed spaced over a memory region of a semiconductor substrate is formed.

At 204, a polysilicon layer, a dielectric layer, and a bottom anti-reflective coating (BARC) layer are formed, in that order, over the semiconductor substrate and the gate stacks.

At 206, etch backs are performed into the BARC layer, the dielectric layer, and the polysilicon layer, in that order, to form a polysilicon erase gate between the gate stacks.

At 208, the remaining BRAC and dielectric layers are removed.

At 210, dopants are implanted into the remaining polysilicon layer.

At 212, hard masks are formed over the erase gate, and logic gate and word line regions of the doped polysilicon layer.

At 214, an etch is performed into regions of the doped polysilicon layer unmasked by the hard masks to form polysilicon word lines over the memory region and polysilicon logic gates over the logic region.

At 216, dopants are implanted into the semiconductor substrate to form source/drain regions neighboring the word lies and the logic gates.

At 218, the hard masks are removed.

At 220, spacers are formed along sidewalls of the word lines and the logic gates.

At 222, silicide pads are formed over the erase gate, the word lines, and the source/drain regions.

At 224, a contact etch stop layer and an ILD layer are formed, in that order, over the polysilicon silicon layer, the silicide pads, and the gate stacks.

At 226, contacts are formed through the contact etch stop layer and the ILD layer to the word lines, the gate stack, the erase gate, the logic gates, and the source/drain regions.

Advantageously, the method self-aligns the word lines and is compatible with next generation manufacturing processes using 28 nm or smaller feature sizes. Further, the method advantageously reduces costs relative to other methods using HKMG technology due to the use of a shared polysilicon layer for the word lines, the erase gate, and the logic devices and a simplified process.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-19 cross-sectional and top views of some embodiments of an embedded flash memory device at various stages of manufacture are provided to illustrate the method of FIG. 2. Although FIGS. 3-19 are described in relation to the method, it will be appreciated that the structures disclosed in FIGS. 3-19 are not limited to the method, but instead may stand alone as structures independent of the method. Similarly, although the method is described in relation to FIGS. 3-19, it will be appreciated that the method is not limited to the structures disclosed in FIGS. 3-19, but instead may stand alone independent of the structures disclosed in FIGS. 3-19.

Figure 3:
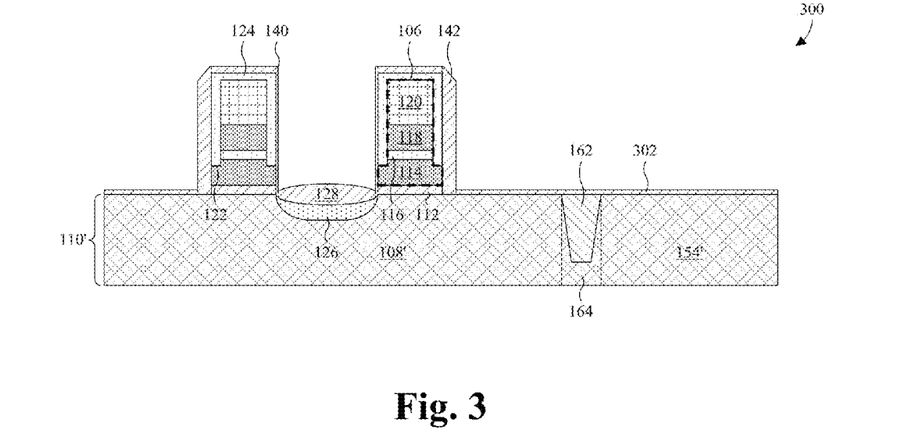
FIGS. 3-19 illustrates a series of cross-sectional views of some embodiments of an embedded flash memory device at intermediate stages of manufacture, the semiconductor structure having a split-gate flash memory cell device and a low power logic device.

FIG. 3 illustrates a cross-sectional view 300 of some embodiments corresponding to Act 202 of FIG. 2.

As illustrated by FIG. 3, a pair of gate stacks 106 are formed or provided spaced over a memory region 108' of a semiconductor substrate 110'. The memory region 108' is spaced from a logic region 154' of the semiconductor substrate 110' by an intermediate region 164 of the semiconductor substrate 110'. The intermediate region 164 includes an isolation region 162 that isolates memory cell devices over the memory region 108' from logic devices over the logic region 154'.

A gate stack 106 of the pair, typically of each gate stack 106 of the pair, includes a floating gate dielectric region 112, a floating gate 114, a control gate dielectric region 116, a control gate 118, and a hard mask 120. The floating gate 114 is arranged over the memory region 108 with the floating gate dielectric region 112 interposed between the memory region 108' and the floating gate 114. Further, the floating gate 114 includes a floating gate ledge 122 exhibiting a reduced height relative to a top surface of the floating gate 114 and extending around a core region of the floating gate 114. The control gate 118 is arranged over the core region with the control gate dielectric region 116 interposed between the core region and the control gate 118. The hard mark 120 is arranged over the control gate 118, and is, for example, silicon nitride. In some embodiments, the hard mask 120 has a thickness or height of about 1000 Angstroms.

Also illustrated by FIG. 3, dielectric liners 124 corresponding to the gate stacks 106 are formed or provided extending from the floating gate ledges 122 of the gate stacks 106 to line the control gate dielectric regions 116, the control gates 118, and the hard masks 120. Further, a first dielectric layer 302 is formed or provided to line the gate stacks 106, the dielectric liners 124, and the semiconductor substrate 110'. The first dielectric layer 302 includes dielectric spacer regions 140, 142 arranged along opposing sidewalls of the gate stacks 106, as well as an erase gate dielectric region 128 arranged over a first memory source/drain region 126 between gate stacks 106. The first dielectric layer 302 is, for example, an oxide, such as silicon dioxide.

Figure 4:
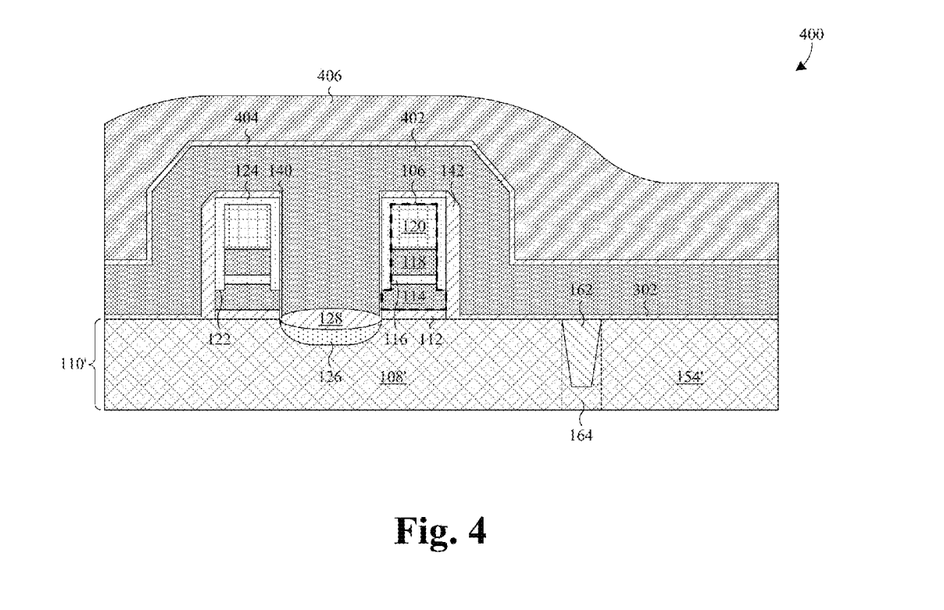

FIG. 4 illustrates a cross-sectional view 400 of some embodiments corresponding to Act 204 of FIG. 2.

As illustrated by FIG. 4, a polysilicon layer 402, a second dielectric layer 404, and a BARC layer 406 are formed, in that order, over the semiconductor substrate 110', the first dielectric layer 302, and the gate stacks 106. The second dielectric layer 404 is, for example, an oxide, such as silicon dioxide. In some embodiments, the polysilicon layer 402 has a thickness of about 700 Angstroms, the second dielectric layer 404 has a thickness of about 80 Angstroms, and/or the BARC layer 406 has a thickness of about 1200 Angstroms.

Figure 5:
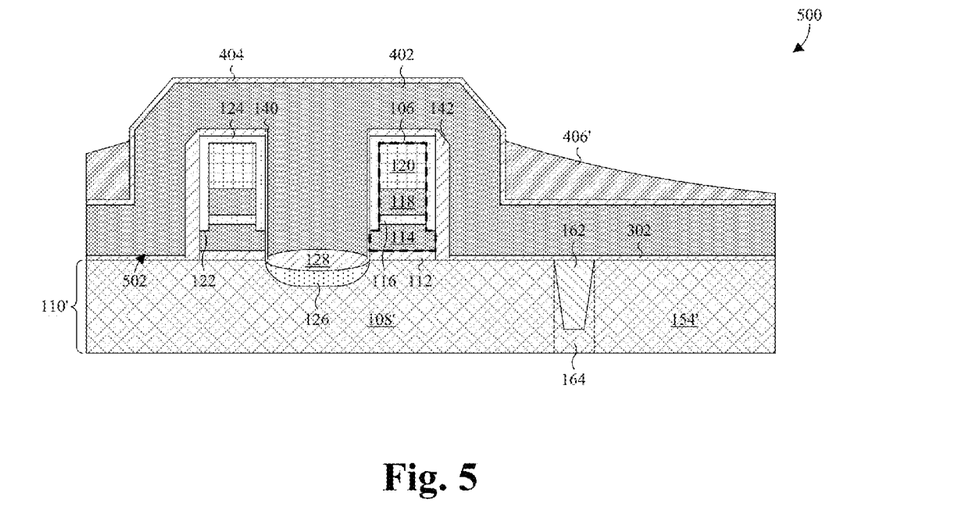
Figure 6:
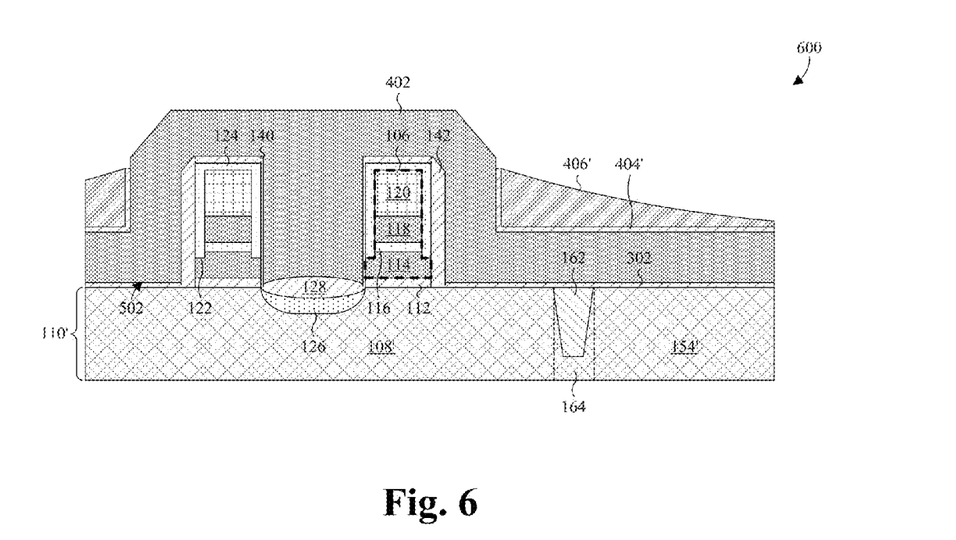
Figure 7:
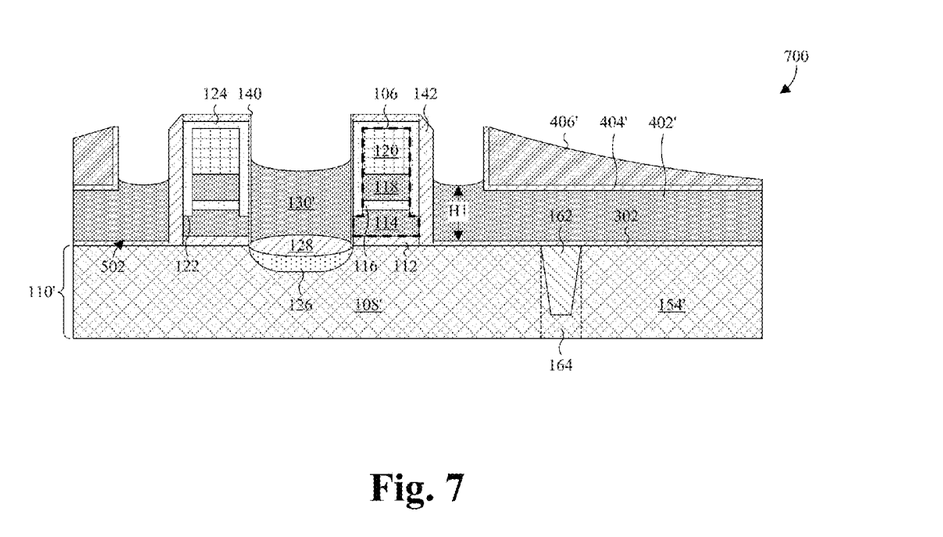

FIGS. 5-7 illustrate cross-sectional views 500, 600, 700 of some embodiments corresponding to Act 206 of FIG. 2.

As illustrated by FIG. 5, a first etch back is performed into the BARC layer 406 to etch the BARC layer 406 back to below the top surfaces of the gate stacks 106. In performing the first etch back, regions of the BARC layer 406 overlying the gate stacks 106, the erase gate dielectric region 128, and word line regions 502 of the polysilicon layer 402 are substantially removed. The first etch back may be performed by exposing the BARC layer 406 to an etchant that preferentially etches the BARC layer 406 for a predetermined period of time.

As illustrated by FIG. 6, a second etch back is performed into the second dielectric layer 404 to etch the second dielectric layer 404 back to below the top surfaces of the gate stacks 106 and/or to a pinnacle of the remaining BARC layer 406'. In performing the second etch back, regions of the second dielectric layer 40 unmasked by the BARC layer 406 are substantially removed. The second etch back may be performed by exposing the second dielectric layer 404 to an etchant that preferentially etches the second dielectric layer 404 for a predetermined period of time.

As illustrated by FIG. 7, a third etch back is performed into the polysilicon layer 402 to etch the polysilicon layer 402 back to below the top surfaces of the gate stacks 106, the top surfaces of the control gates 118, a pinnacle of the remaining BARC layer 406', and/or below a pinnacle of the remaining second dielectric layer 404'. The third etch back is performed into regions of the polysilicon layer 402 lining the gate stacks 106 while peripheral regions are masked by the remaining BARC layer 406' and the remaining second dielectric layer 404'. In performing the third etch back, a polysilicon erase gate 130' is formed over the erase gate dielectric region 128 between the gate stacks 106. The third etch back may be performed by exposing the polysilicon layer 402 to an etchant that preferentially etches the polysilicon layer 402 for a predetermined period of time. In some embodiments, the word line regions 502 are etched back to a height H1 that is about 800 Angstroms.

Figure 8:
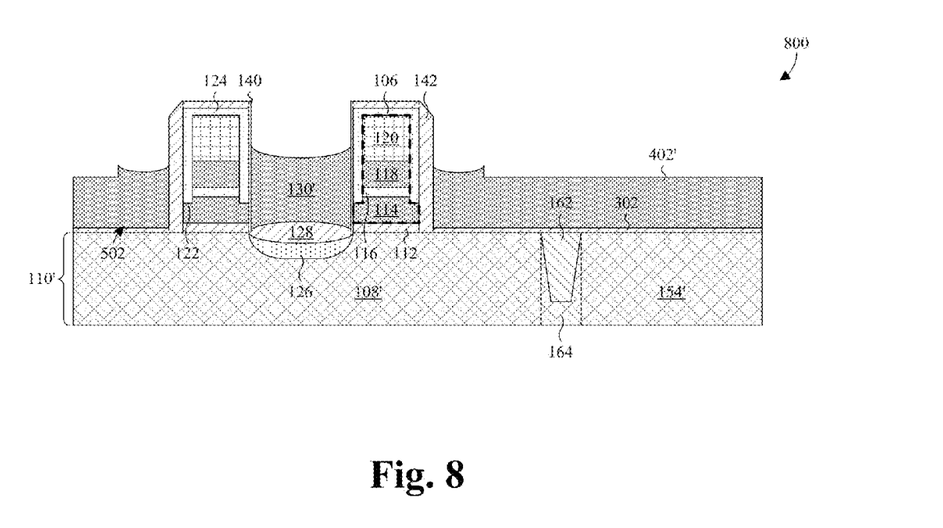

FIG. 8 illustrates a cross-sectional view 800 of some embodiments corresponding to Act 208 of FIG. 2.

As illustrated by FIG. 8, the remaining second dielectric layer 404' and the remaining BARC layer 406' are removed, while leaving the remaining polysilicon layer 402'. The removal may include the sequential application of etchants preferential of the remaining second dielectric layer 404' and the remaining BARC layer 406'.

Figure 9:
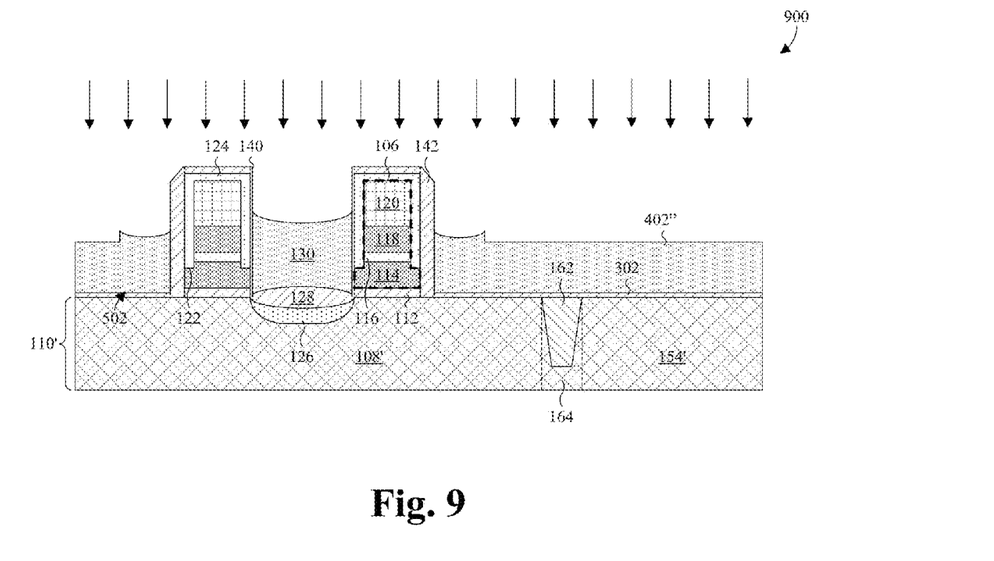

FIG. 9 illustrates a cross-sectional view 900 of some embodiments corresponding to Act 210 of FIG. 2.

As illustrated by FIG. 9, dopants are implanted into the remaining polysilicon layer 402' and the erase gate 130'. The dopants may be n-type or p-type, but are typically n-type. In some embodiments, after implanting the dopants, the doped polysilicon layer 402" and the doped erase gate 130 undergo an annealing process.

Figure 10:
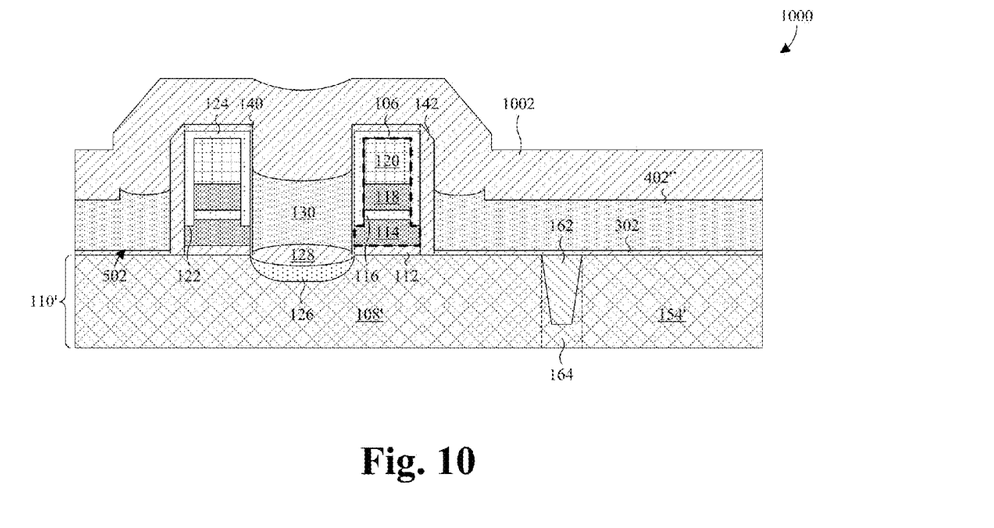
Figure 11:
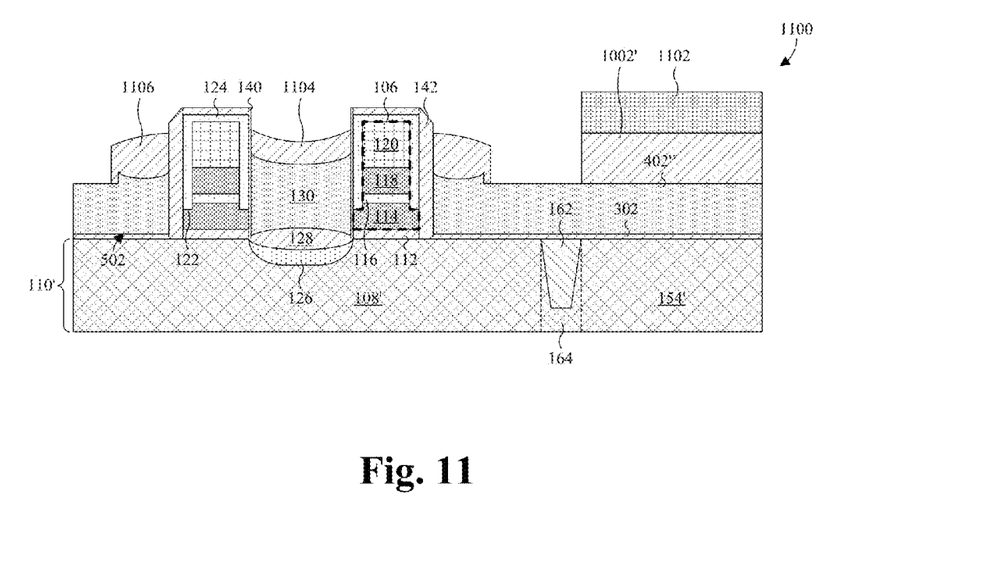
Figure 12:
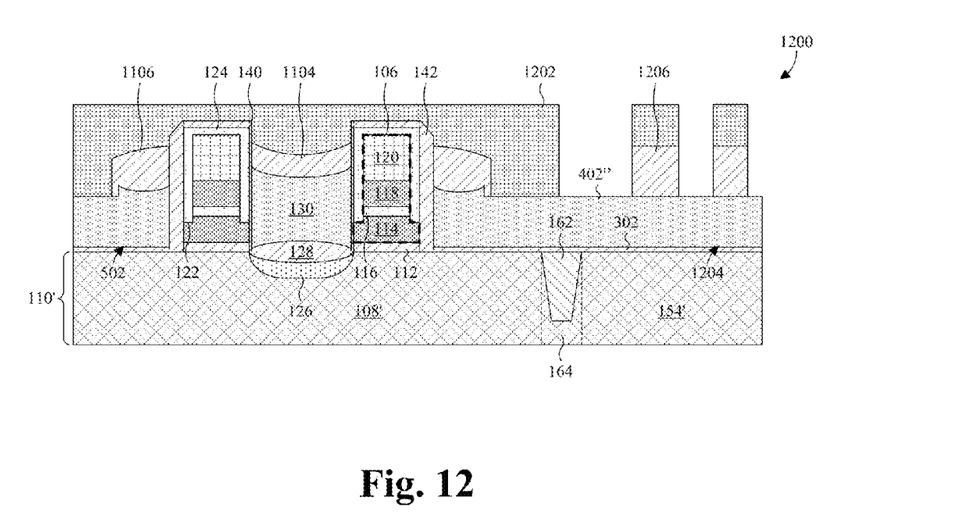

FIGS. 10-12 illustrate cross-sectional views 1000, 1100, 1200 of some embodiments corresponding to Act 212 of FIG. 2.

As illustrated by FIG. 10, a hard mask layer 1002 is formed over the doped polysilicon layer 402" and the doped erase gate 130. In some embodiments, the hard mask layer 1002 is formed with a thickness of about 700 Angstroms. The hard mask layer 1002 is, for example, an oxide, such as silicon dioxide.

As illustrated by FIG. 11, a fourth etch back is performed into regions of the hard mask layer 1002 overlying the memory and intermediate regions 108', 164, while the logic region 154' is masked by a first photoresist layer 1102. In some embodiments, the first photoresist layer 1102 has a thickness of about 500 Angstroms. The fourth etch back is performed to below a top surface of the gate stacks 106, and removes regions of the hard mask layer 1002 overlying the gate stacks 106 and between the word line regions 502 and the logic regions 154'. In removing such regions, erase gate and word line hard masks 1104, 1106 are formed overlying the doped erase gate 130 and the word line regions 502. The word line hard masks 1106 extend laterally passed sidewalls of the doped polysilicon layer 402" opposite the gate stacks 106 and include sidewalls laterally spaced from the sidewalls of the doped polysilicon layer 402" opposite the gate stacks 106. The fourth etch back may be performed by exposing the hard mask layer 1002 to an etchant that preferentially etches the hard mask layer 1002 for a predetermined period of time.

As illustrated by FIG. 12, a first etch is performed through regions of the remaining hard mask layer 1002' unmasked by a second photoresist layer 1202 overlying the memory region 108' and logic gate regions 1204 of the of the doped polysilicon layer 402". In performing the first etch, logic gate hard masks 1206 are formed from the remaining hard mask layer 1002' over the logic gate regions 1204. In some embodiments, the first etch includes two sub-etches with individual masks. The process for the first etch may include applying an unpatterned photoresist layer, patterning the unpatterned photoresist layer to form the second photoresist layer 1202, applying an etchant preferential of the remaining hard mask layer 1002', and removing the second photoresist layer 1202.

Figure 13:
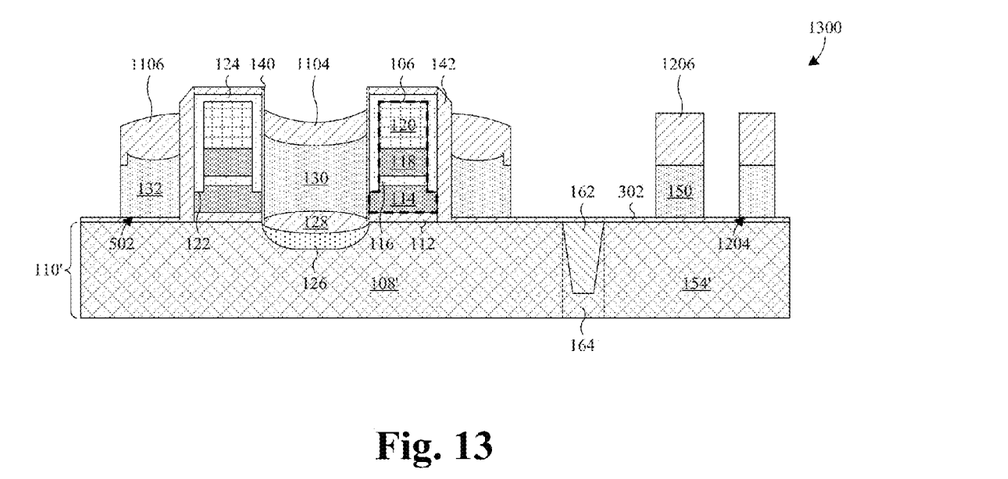

FIG. 13 illustrates a cross-sectional view 1300 of some embodiments corresponding to Act 214 of FIG. 2.

As illustrated by FIG. 13, the second photoresist layer 1202 is removed and a second etch is performed through regions of the of the doped polysilicon layer 402" unmasked by the erase gate, word line, and logic gate hard masks 1104, 1106, 1206. In performing the second etch, word lines 132 and logic gates 150 are formed. The word lines 132 neighbor corresponding gate stacks 106 opposite the erase gates 130, and the logic gates 150 are spaced over the logic region 154'. Advantageously, the word lines 132 are self-aligned with the gate stacks 106. The process for the second etch may include applying an etchant preferential of the doped polysilicon layer 402".

Figure 14:
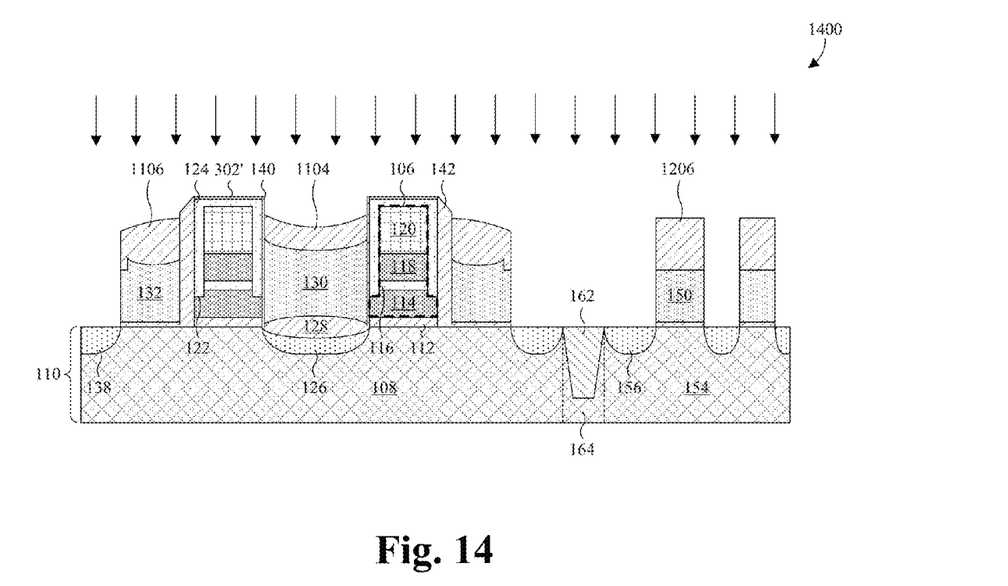

FIG. 14 illustrates a cross-sectional view 1400 of some embodiments corresponding to Act 216 of FIG. 2.

As illustrated by FIG. 14, dopants are implanted into the semiconductor substrate 110' to form second memory source/drain regions 138 neighboring the word lines 132 and logic source/drain regions neighboring the logic gates 150. During the implant, the erase gate, word line, and logic gate hard masks 1104, 1106, 1206 mask the word lines 132, the erase gate 130, and the logic gates 150. Further, in some embodiments, as part of the implant process, uncovered regions of the first dielectric layer 302 are etched back to expose the semiconductor substrate 110'. The dopants may be n-type or p-type, but are typically n-type.

Figure 15:
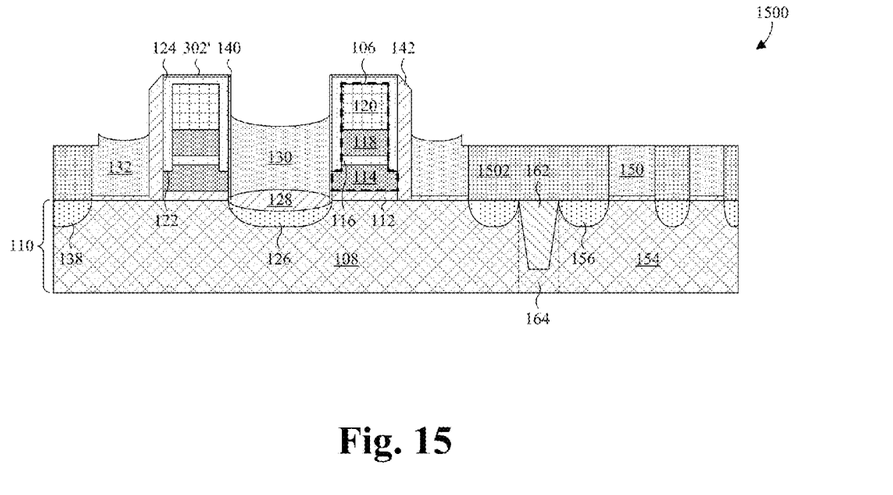

FIG. 15 illustrates a cross-sectional view 1500 of some embodiments corresponding to Act 218 of FIG. 2.

As illustrated by FIG. 15, the erase gate, word line, and logic gate hard masks 1104, 1106, 1206 are removed. The process for removing the hard masks 1104, 1106, 1206 may include forming a photoresist layer between and over the hard masks 1104, 1106, 1206, etching the photoresist layer back to below the top surfaces of the word lines 132, applying an etchant preferential of the hard masks 1104, 1106, 1206 over the etched back photoresist layer 1502, and removing the etched back photoresist layer 1502.

Figure 16:
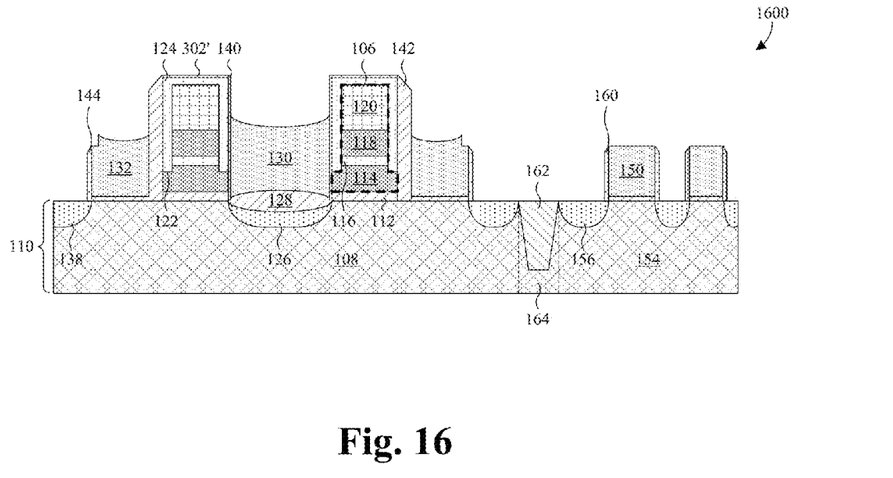

FIG. 16 illustrates a cross-sectional view 1600 of some embodiments corresponding to Act 220 of FIG. 2.

As illustrated by FIG. 16, word line and logic gate spacers 144, 160 are respectively formed along sidewalls of the word lines 132 and the logic gates 150. The process for forming the spacers 144, 160 may include forming a conformal spacer layer along the word lines 132 and the logic gates 150, forming a photoresist layer between and over the word lines 132 and the logic gates 150, etching the photoresist layer back to below the top surfaces of the word lines 132 and the logic gates 150, applying an etchant preferential of the spacer layer over the etched back photoresist layer, and removing the etched back photoresist layer. The spacers 144, 160 are, for example, silicon nitride.

Figure 17:
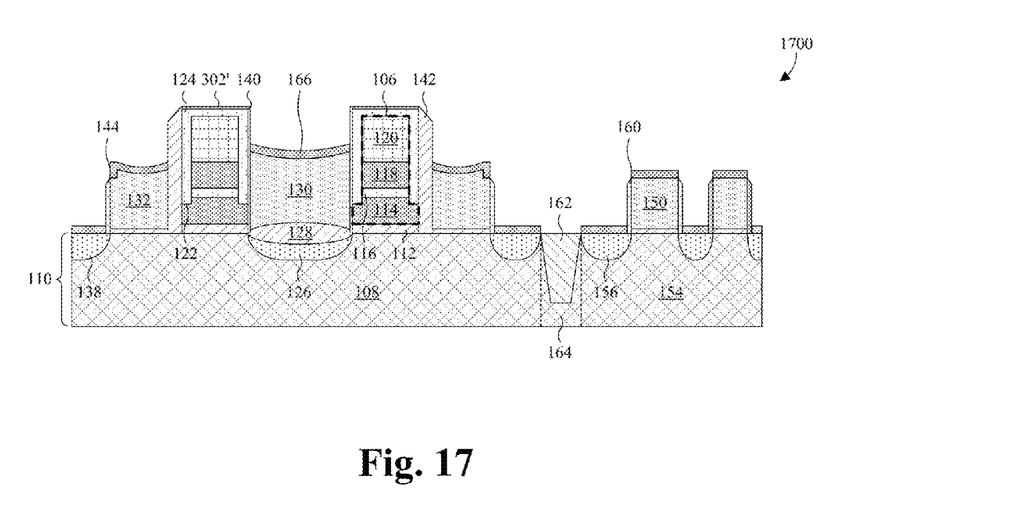

FIG. 17 illustrates a cross-sectional view 1700 of some embodiments corresponding to Act 222 of FIG. 2.

As illustrated by FIG. 17, silicide pads 166 are formed over the second memory source/drain regions 138 and the logic source/drain regions 156, as well as over the word lines 132, the erase gate 130, and the logic gates 150. The formation of the silicide pads 166 may include: forming a conformal metal layer over the semiconductor structure; heat treating the semiconductor structure to invoke a reaction between the conformal metal layer, the semiconductor substrate 110, the word lines 132, and the logic and erase gates 130, 150; and removing the unreacted regions of the conformal metal layer. The silicide pads 166 are, for example, nickel silicide or titanium silicide.

Figure 18:
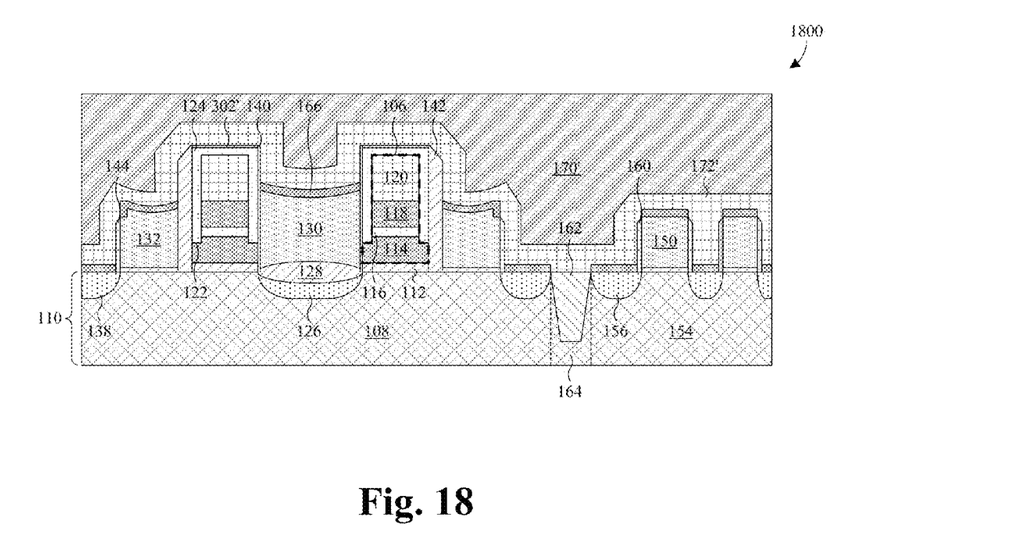

FIG. 18 illustrates a cross-sectional view 1800 of some embodiments corresponding to Act 224 of FIG. 2.

As illustrated by FIG. 18, a contact etch stop layer 172' and an ILD layer 170' are formed, in that order, over the silicide pads 166, the gate stacks 106, the erase gates 130, the logic gates 150, and the word lines 132. The contact etch stop layer 172' is, for example, silicon nitride, and the ILD layer 170' is, for example, an oxide, such as silicon dioxide, or a low κ dielectric. In some embodiments, the process for forming the ILD layer 170' includes forming an intermediate ILD layer and performing a chemical-mechanical planarization (CMP) of the intermediate ILD layer.

Figure 19:
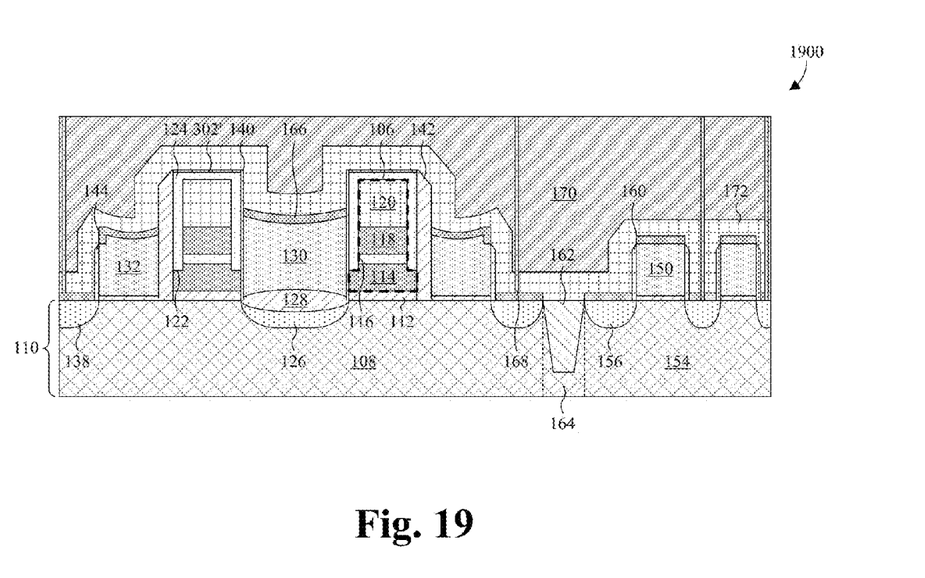

FIG. 19 illustrates a cross-sectional view 1900 of some embodiments corresponding to Act 226 of FIG. 2.

As illustrated by FIG. 19, contacts 168 are formed through the contact etch stop layer 172' and the ILD layer 170' to one or more of the word lines 132, the erase gate 130, the control gates 118, the logic gates 150, the second memory source/drain regions 138, and the logic source/drain regions 156. The contacts 168 are, for example, metal, such as tungsten.

Thus, as can be appreciated from above, the present disclosure provides an embedded flash memory device. A gate stack includes a control gate arranged over a floating gate. An erase gate is arranged adjacent to a first side of the gate stack. A word line is arranged adjacent to a second side of the gate stack that is opposite the first side. The word line includes a word line ledge exhibiting a reduced height relative to a top surface of the word line and on an opposite side of the word line as the gate stack. A polysilicon logic gate has a top surface approximately even with the word line ledge. An ILD layer is arranged over the gate stack, the erase gate, the polysilicon logic gate, and the word lines. A contact extends through the ILD layer to one of the erase gate, the word lines, and the polysilicon logic gate.

In other embodiments, the present disclosure provides a method for manufacturing an embedded flash memory device. A pair of gate stacks is formed spaced over a semiconductor substrate. The gate stacks include floating gates and control gates arranged over the floating gates. A polysilicon layer is formed over the gate stacks and the semiconductor substrate. An etch back of regions of the polysilicon layer lining the gate stacks is performed to below top surfaces of the gate stacks, while peripheral regions of the polysilicon layer are masked, to form an erase gate between the gate stacks. Hard masks are formed over the erase gate, word line regions of the remaining polysilicon layer, and logic gate regions of the remaining polysilicon layer. An etch is performed through regions of the remaining polysilicon layer unmasked by the hard masks to form word lines and logic gates. An interlayer dielectric (ILD) layer, and contacts through the ILD layer, are formed over the gate stacks, the erase gate, the word lines, and the logic gates.

In yet other embodiments, the present disclosure provides an integrated circuit for an embedded flash memory device. A pair of gate stacks is spaced over a semiconductor substrate. The gate stacks include floating gates and control gates arranged over the floating gates. An erase gate is arranged over the semiconductor substrate between the gate stacks. Word lines are arranged over the semiconductor substrate adjacent to corresponding gate stacks and on opposite sides of the gate stacks as the erase gate. The word lines include word line ledges exhibiting reduced heights relative to top surfaces of the word lines. A polysilicon logic gate has a top surface approximately even with the word line ledges. An ILD layer is arranged over the gate stacks, the polysilicon logic gate, and the word lines. A contact extends through the ILD layer to one of the erase gate, the word lines, and the polysilicon logic gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An embedded flash memory device comprising:
    a gate stack including a control gate arranged over a floating gate;
    an erase gate arranged adjacent to a first side of the gate stack;
    a word line arranged adjacent to a second side of the gate stack that is opposite the first side, wherein the word line includes a word line ledge exhibiting a reduced height relative to a top surface of the word line and on an opposite side of the word line as the gate stack;
    a polysilicon logic gate with a top surface approximately even with the word line ledge;
    an interlayer dielectric (ILD) layer arranged over the gate stack, the erase gate, the polysilicon logic gate, and the word line; and
    a contact extending through the ILD layer to one of the erase gate, the word line, and the polysilicon logic gate.

2. The embedded flash memory device according to claim 1, wherein the gate stack further includes a hard mask arranged over the control gate.

3. The embedded flash memory device according to claim 1, wherein the floating gate has a floating gate ledge exhibiting a reduced height relative to a top surface of the floating gate and surrounding a core region of the floating gate, and wherein the embedded flash memory device further includes:
    a dielectric liner extending from the floating gate ledge over a top surface of the gate stack.

4. The embedded flash memory device according to claim 3, wherein the dielectric liner is an oxide-nitride-oxide (ONO) film.

5. The embedded flash memory device according to claim 1, wherein the top surface of the word line has a height of approximately 800 Angstroms, and wherein the word line ledge has a height of approximately 700 Angstroms.

6. The embedded flash memory device according to claim 1, further including:
    silicide pads arranged over the word line, the erase gate, and the polysilicon logic gate.

7. The embedded flash memory device according to claim 1, wherein the top surface of the word line exhibits a reduced height relative to a top surface of the gate stack.

8. The embedded flash memory device according to claim 1, further including:
    a second gate stack arranged on an opposite side of the erase gate as the gate stack, wherein the second gate stack includes a second control gate arranged over a second floating gate; and
    a second word line arranged adjacent to the second gate stack on an opposite side of the second gate stack as the erase gate, wherein the second word line includes a second word line ledge exhibiting a reduced height relative to a top surface of the second word line;
    wherein the top surface of the polysilicon logic gate is approximately even with the second word line ledge.

9. The embedded flash memory device according to claim 1, wherein the erase gate, the word line, and the polysilicon logic gate share a crystalline structure.

10. The embedded flash memory device according to claim 1, wherein an isolation region is arranged laterally between the gate stack and the polysilicon logic gate.

11. The embedded flash memory device according to claim 1, wherein a silicide pad extends to the top surface of the word line from the word line ledge, and further extends laterally across the top surface of the word line.

12. An integrated circuit for an embedded flash memory device, the integrated circuit comprising:
 a pair of gate stacks laterally spaced over a semiconductor substrate, wherein each of the gate stacks comprises a floating gate and a control gate arranged over the floating gate;
 an erase gate arranged between opposing bottommost sidewalls of the gate stacks;
 a pair of word lines arranged on opposite outer sidewalls of the gate stacks, wherein the word lines include word line ledges exhibiting reduced heights relative to top surfaces of the word lines; and
 a polysilicon logic gate with a top surface approximately even with the word line ledges.

13. The integrated circuit according to claim 12, wherein each of the gate stacks further comprises a hard mask arranged over the control gate.

14. The integrated circuit according to claim 12, wherein the floating gate has a floating gate ledge that exhibits a reduced height relative to a top surface of the floating gate and that surrounds a core region of the floating gate, and wherein the integrated circuit further comprises:
 a dielectric liner extending over a top surface of one of the gate stacks from the floating gate ledge.

15. The integrated circuit according to claim 12, further comprising:
 silicide pads arranged over the word lines, the erase gate, and the polysilicon logic gate.

16. The integrated circuit according to claim 12, wherein the top surfaces of the word lines exhibit reduced heights relative to top surfaces of the gate stacks.

17. The integrated circuit according to claim 12, wherein the erase gate, the word lines, and the polysilicon logic gate share a crystalline structure.

18. The integrated circuit according to claim 12, wherein an isolation region extends into the semiconductor substrate and is arranged laterally between one of the gate stacks and the polysilicon logic gate.

19. An integrated circuit comprising:
 a memory cell comprising a gate stack arranged laterally between an erase gate and a word line, wherein the gate stack comprises a control gate arranged over a floating gate and a hard mask arranged over the control gate, and wherein the word line includes a ledge that is below a top surface of the word line;
 a logic device laterally spaced from the memory cell and comprising a gate electrode, wherein a top surface of the gate electrode is even with the ledge, and wherein the gate electrode and the word line have a same crystalline structure; and
 an interlayer dielectric (ILD) layer covering the memory cell and the logic device.

20. The integrated circuit according to claim 19, wherein a distance between opposite sidewall surfaces of the word line, at a location above the top surface of the gate electrode, is a same as a height of the gate electrode, and wherein one of the opposite sidewall surfaces faces the gate stack.

* * * * *